United States Patent
Ramaswamy

(10) Patent No.: US 9,159,829 B1
(45) Date of Patent: Oct. 13, 2015

(54) RECESSED TRANSISTORS CONTAINING FERROELECTRIC MATERIAL

(71) Applicant: Micron Technology, Inc., Boise, ID (US)

(72) Inventor: Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/508,912

(22) Filed: Oct. 7, 2014

(51) Int. Cl.
*H01L 29/78* (2006.01)
*H01L 29/423* (2006.01)

(52) U.S. Cl.
CPC ...... *H01L 29/78391* (2014.09); *H01L 29/4236* (2013.01)

(58) Field of Classification Search
CPC .................................................... H01L 29/784
See application file for complete search history.

(56) References Cited

U.S. PATENT DOCUMENTS

| | | | | |
|---|---|---|---|---|
| 5,976,928 A * | 11/1999 | Kirlin et al. | | 438/240 |
| 6,370,056 B1 | 4/2002 | Chen et al. | | |
| 8,304,823 B2 | 11/2012 | Boescke | | |
| 2003/0001189 A1 * | 1/2003 | Fujiwara et al. | | 257/303 |
| 2003/0175487 A1 * | 9/2003 | Kita | | 428/209 |
| 2004/0002176 A1 * | 1/2004 | Xu | | 438/40 |
| 2011/0248324 A1 | 10/2011 | Kang | | |
| 2012/0248398 A1 | 10/2012 | Liu | | |
| 2013/0020575 A1 * | 1/2013 | Ishizuka et al. | | 257/60 |
| 2013/0043455 A1 | 2/2013 | Bateman | | |
| 2013/0056698 A1 | 3/2013 | Satoh et al. | | |

FOREIGN PATENT DOCUMENTS

WO WO 2008-073529 6/2008
WO PCT/US2014/047570 11/2014

OTHER PUBLICATIONS

U.S. Appl. No. 13/964,309, filed Aug. 12, 2013, Karda et al.
U.S. Appl. No. 14/152,664, filed Jan. 10, 2014, Karda.
U.S. Appl. No. 14/260,977, filed Apr. 24, 2014, Ramaswamy.
Breakdown of High-Performance Monolayer MoS2 Transistors; Lembke et al.; www.acsnano.org; Oct. 2012; pp. A-F.
Current Status of Ferroelectric Random-Acess Memory; Arimoto et al.; MRS Bulletin; Nov. 2004; pp. 823-828.
Das et al.; High Performance Multilayer MoS2 Transistors with Scandium Contacts; NANO Letters; ACS Publications; Dec. 14, 2012; pp. 100-105.

(Continued)

*Primary Examiner* — Colleen A Matthews
*Assistant Examiner* — David S Wilbert
(74) *Attorney, Agent, or Firm* — Wells St. John P.S.

(57) ABSTRACT

Some embodiments include transistor constructions having a first insulative structure lining a recess within a base. A first conductive structure lines an interior of the first insulative structure, and a ferroelectric structure lines an interior of the first conductive structure. A second conductive structure is within a lower region of the ferroelectric structure, and the second conductive structure has an uppermost surface beneath an uppermost surface of the first conductive structure. A second insulative structure is over the second conductive structure and within the ferroelectric structure. A pair of source/drain regions are adjacent an upper region of the first insulative structure and are on opposing sides of the first insulative structure from one another.

29 Claims, 1 Drawing Sheet

(56) References Cited

OTHER PUBLICATIONS

Ferroelectric Nonvolatile Nanowire Memory Circuit Using a Single ZnO Nanowire and Copolymer Top Layer; Tack Lee et al.; Advanced Materials 2012, 24, pp. 3020-3025.
Ferroelectric RAM; http://en.wikipedia.org/wiki/Ferroelectric_RAM; Last Modified Feb. 25, 2013; 6 pp.
Large Area Vapor Phase Growth and Characterization of MoS2 Atomic Layers on SiO2 Substrate; Zhan et al.; Dept. of Mechanical Engineering & Materials Science; Rice University: Feb. 15, 2012; 24 pp.
Liu et al.; Growth of Large-Area and Highly Crystailine MoS2 Thin Layers on Insulating Substrates; NANO Letters; ACS Publications; Feb. 27, 2012; pp. 1538-1544.
Min et al.; Nanosheet thickness-modulated MoS2 dielectric property evidenced by field-effect transistor performance; The Royal Society of Chemistry; Dec. 3, 2012; 2 pp.
MoS 2 Nanosheets for Top-Gate Nonvolatile Memory Transistor Channel; Sung Lee et al.; Small 2012,8, No. 20, pp. 3111-3115.
Nonvolatile ferroelectric-gate field-effect transistors using SrBi2Ta2O9/Pt/SRTa2O6/SiON/Si structures; E. Tokumitsu; Applied Physics Letters, vol. 75, No. 4; Jul. 26, 1999; pp. 575-577.
R.S. Lous; Ferroelectric Memory Devices, How to store information of the future; Top Master Programme in Nanoscience; Jul. 2011; 23 pp.
Recent Progress of Ferroelectric-Gate Field-Effect Transistors and Applications to Nonvolatile Logic and FeNAND Flash Memory; Sakai et al.; Materials 2010, 3, Nov. 18, 2010; pp. 4950-4964.
Single-layer MoS2 transistors; Radisavijevic et al.; Nature Nanotechnology; vol. 6; Mar. 2011; pp. 147-150.
W. Liu et al.; Role of Metal Contacts in Designing High-Performance Monolayer n-Type WSe2 Field Effect Transistors; NANO Letters; ACS Publications; Mar. 25, 2013; pp. 1983-1990.
Zhang et al.; Ambipolar MoS2 thin Flake Transistors; NANO Letters; ACS Publications; Jan. 25, 2012; pp. 1136-1140.

\* cited by examiner

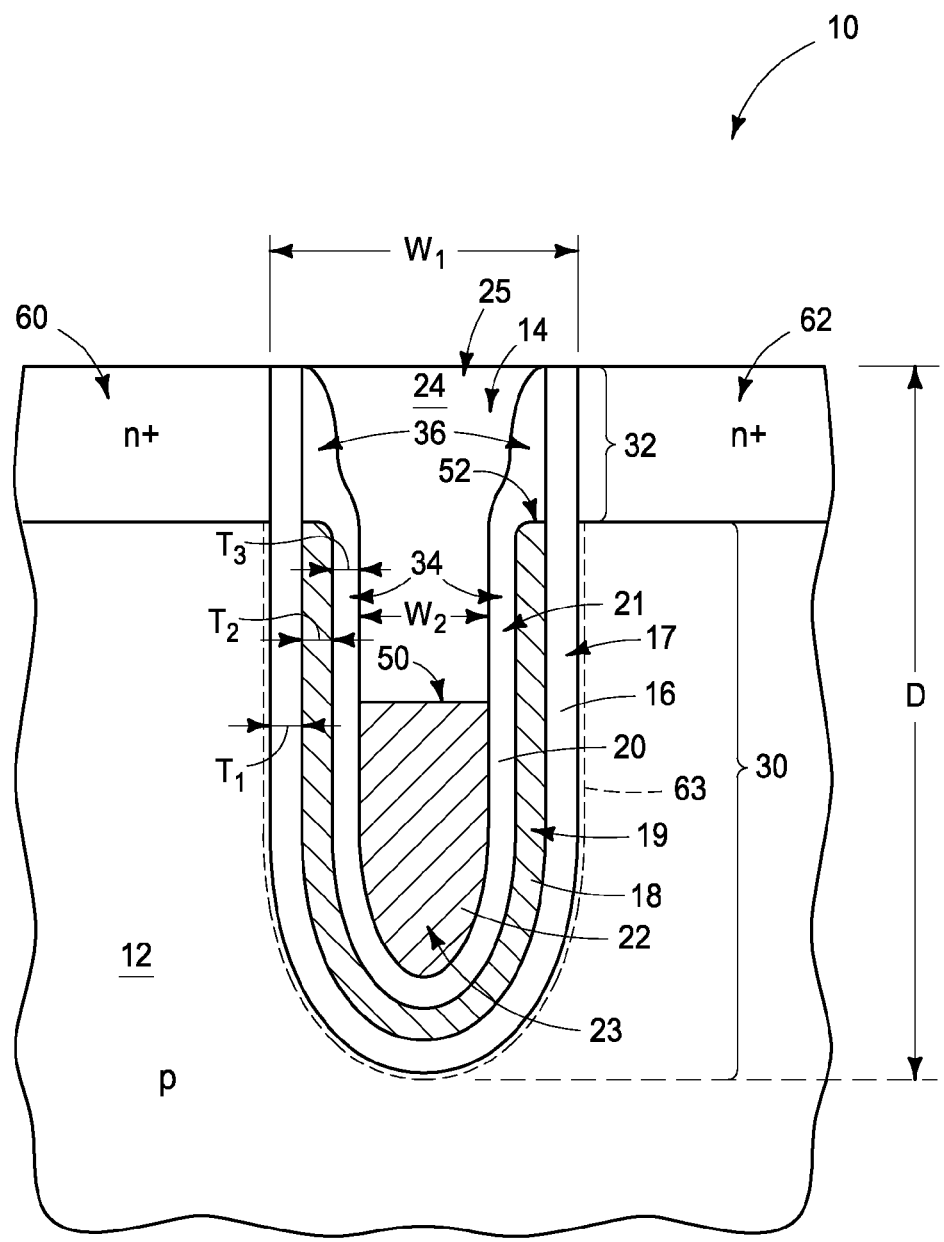

US 9,159,829 B1

RECESSED TRANSISTORS CONTAINING FERROELECTRIC MATERIAL

TECHNICAL FIELD

Recessed transistors containing ferroelectric material.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bitlines, data lines, sense lines, or data/sense lines) and access lines (which may also be referred to as wordlines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile or non-volatile. Non-volatile memory cells can store data for extended periods of time including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field-effect transistors may also include additional structure, for example reversibly programmable charge storage regions as part of the gate construction. Transistors other than field-effect transistors, for example bipolar transistors, may additionally or alternately be used in memory cells. Transistors may be used in many types of memory. Further, transistors may be used and formed in arrays other than memory.

One type of transistor is a ferroelectric field effect transistor (FeFET) wherein at least some portion of the gate construction comprises ferroelectric material. Such materials are characterized by two stable polarized states. These different states in field effect transistors may be characterized by different threshold voltage (Vt) for the transistor or by different channel conductivity for a selected operating voltage. Polarization state of the ferroelectric material can be changed by application of suitable programming voltages, and which results in one of high channel conductance or low channel conductance. The high and low conductance, invoked by the ferroelectric polarization state, remains after removal of the programming gate voltage (at least for a time). The status of the channel can be read by applying a small drain voltage which does not disturb the ferroelectric polarization.

BRIEF DESCRIPTION OF THE DRAWINGS

The FIGURE is a diagrammatic cross-sectional view of an example embodiment recessed FeFET.

DETAILED DESCRIPTION OF THE ILLUSTRATED EMBODIMENTS

A problem that can occur with conventional FeFETs is that interfacial oxide may encounter breakdown before a polarization state of the ferroelectric material is fully switched. This can lead to difficulties in cycling the ferroelectric material and/or can lead to difficulties in fully switching the ferroelectric material. In some embodiments presented herein, recessed FeFETs are presented. Such recessed devices may alleviate or prevent the problematic interfacial oxide breakdown associated with conventional FeFETs.

Referring to the FIGURE, an example embodiment transistor construction 10 is shown to be incorporated into a base 12.

The base 12 may comprise semiconductor material, and in some embodiments may comprise, consist essentially of, or consist of monocrystalline silicon. In some embodiments, base 12 may be considered to comprise a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, base 12 may correspond to a semiconductor substrate containing one or more materials associated with integrated circuit fabrication. Some of the materials may be under the shown region of base 12 and/or may be laterally adjacent the shown region of base 12; and may correspond to, for example, one or more of refractory metal materials, barrier materials, diffusion materials, insulator materials, etc.

The semiconductor base is shown to comprise a p-type doped region and n-type doped regions (with the n-type doped regions being specifically shown to be heavily-doped "n+" regions).

A recess 14 extends into base 12. The recess extends to a depth "D". Such depth may be any suitable dimension; and in some embodiments may be within a range of from about 500 Å to about 5000 Å. The recess has a width "$W_1$". Such width may be any suitable dimension; and in some embodiments may be within a range of from about 14 nm to about 20 nm.

An insulative material 16 lines the recess. The insulative material is configured as a structure 17 having an upwardly-opening container shape. The insulative material 16 may be referred to as a first insulative material to distinguish it from other insulative materials of construction 10, and the structure 17 may be referred to as a first insulative structure. The insulative structure 17 may be homogeneous (as shown) or may comprise multiple discrete materials (for instance, a laminate). In some embodiments, the structure 17 may comprise, consist essentially of, or consist of one or more oxides. In some embodiments, the structure 17 may comprise, consist essentially of, or consist of one or both of silicon dioxide and silicon nitride.

The insulative material 16 has a thickness "$T_1$". Such thickness may be any suitable dimension; and in some embodiments may be within a range of from about 5 Å to about 10 Å.

A conductive material 18 lines an interior of the insulative structure 17, and is configured as a conductive structure 19 having an upwardly-opening container shape. In the shown embodiment, conductive structure 19 is nested within a lower region 30 of the container-shaped insulative structure 17, and is not along an upper region 32 of the insulative structure 17.

The conductive material 18 may be referred to as a first conductive material to distinguish it from other conductive materials of construction 10, and the structure 19 may be referred to as a first conductive structure.

The conductive structure 19 may be homogeneous (as shown) or may comprise multiple discrete materials. In some embodiments, the conductive structure 19 may comprise, consist essentially of, or consist of one or more of various metals (for example, tungsten, titanium, etc.), metal-containing compositions (for instance, metal nitride, metal carbide, metal silicide, etc.), and conductively-doped semiconductor materials (for instance, conductively-doped silicon, conductively-doped germanium, etc.). For instance, in some embodiments the conductive structure 19 may comprise, consist essentially of, or consist of one or both of titanium nitride and tantalum nitride.

The conductive material 18 has a thickness "$T_2$". Such thickness may be any suitable dimension; and in some embodiments may be within a range of from about 10 Å to about 20 Å.

Ferroelectric material 20 is within the container-shaped structures 17 and 19. The ferroelectric material is configured as an upwardly opening container-shaped ferroelectric structure 21. In the shown embodiment, the ferroelectric structure 21 has a lower region 34 within the lower region 30 of insulative structure 17, and has an upper region 36 within the upper region 32 of the insulative structure. The upper region 36 of ferroelectric structure 21 is over conductive structure 19 and is directly against insulative material 16. The lower region 34 of the ferroelectric structure is nested within the container-shaped conductive structure 19.

The ferroelectric structure 21 may be homogeneous (as shown) or may comprise multiple discrete materials. In some embodiments, the ferroelectric structure 21 may comprise, consist essentially of, or consist of one or more metal oxides. For instance, in some embodiments the ferroelectric structure 21 may comprise, consist essentially of, or consist of one or more of aluminum, aluminum oxide, niobium, niobium oxide, zirconium, zirconium oxide, hafnium, hafnium oxide, lead zirconium titanate, and barium strontium titanate. In some embodiments, the ferroelectric material 20 may have dopant therein which comprises one or more of silicon, aluminum, lanthanum, yttrium, erbium, calcium, magnesium, strontium, and a rare earth element. Two specific examples of ferroelectric materials that may be utilized in some embodiments are $Hf_xSi_yO_z$ and $Hf_xZr_yO_z$.

The ferroelectric material 20 has a thickness "$T_3$". Such thickness may be any suitable dimension; and in some embodiments may be within a range of from about 30 Å to about 50 Å.

A conductive material 22 is within the lower region 34 of container-shaped ferroelectric structure 21. The conductive material 22 is configured as a conductive structure 23 which partially fills the container-shape of ferroelectric structure 21. Material 22 may be referred to as a second conductive material, and structure 23 may be referred to as a second conductive structure.

The conductive structure 23 may be homogeneous (as shown) or may comprise multiple discrete materials. In some embodiments, the conductive structure 23 may comprise, consist essentially of, or consist of one or more of various metals (for example, tungsten, titanium, etc.), metal-containing compositions (for instance, metal nitride, metal carbide, metal silicide, etc.), and conductively-doped semiconductor materials (for instance, conductively-doped silicon, conductively-doped germanium, etc.). For instance, in some embodiments the conductive structure 23 may comprise, consist essentially of, or consist of one or both of titanium nitride and tungsten.

The second conductive structure 23 has an uppermost surface 50 which is below an uppermost surface 52 of the first conductive structure 19.

The second conductive structure 23 has a width "$W_2$" across the uppermost surface 50. Such width may be any suitable dimension; and in some embodiments may be within a range of from about 40 Å to about 60 Å.

An insulative material 24 is within the container-shaped ferroelectric structure 21 and over conductive material 22. The insulative material 24 is configured as an insulative structure 25. In some embodiments, insulative material 24 may be referred to as a second insulative material, and structure 25 may be referred to as a second insulative structure.

The insulative structure 25 may be homogeneous (as shown) or may comprise multiple discrete materials. In some embodiments, the structure 25 may comprise, consist essentially of, or consist of one or both of silicon dioxide and silicon nitride.

The n-type doped regions of base 12 form a pair of source/drain regions 60 and 62 which are on opposing sides of the first insulative structure 17 from one another. Channel region 63 is within the p-type doped portion of base 12, and extends from one of the source/drain regions 60/62 to the other. The channel region is along an exterior periphery of insulative structure 17.

Although the source/drain regions are shown n-type doped and the channel region is shown p-type doped, in other embodiments other doping schemes may be utilized. Also, although the channel region is shown comprising a same semiconductor material as a remainder of base 12, in other embodiments at least some of the channel region may comprise a different composition than other regions of the base. The material comprising channel region 63 may be referred to as channel material in some embodiments. Such channel material may comprise monocrystalline silicon of base 12 in some embodiments, or may comprise other semiconductor material in other embodiments. The channel material may be doped differently than other regions of base 12, and may, for example, have threshold voltage dopant provided therein.

In the shown embodiment, the uppermost surfaces 52 of the conductive structure 19 are at about a same level as lowermost surfaces of source/drain regions 60/62 and accordingly there is little, if any, vertical overlap of conductive structure 19 with source/drain regions 60/62. In other embodiments, the conductive structure 19 may extend at least partially along the illustrated upper region 32 of insulative structure 17 so that there is vertical overlap of the conductive structure 19 with the source/drain regions.

The transistor construction 10 may be utilized as a MFMIS (metal-ferroelectric-metal-insulator-substrate) device. Specifically, conductive structure 23 may correspond to a control gate of the device, and conductive structure 19 may correspond to a floating gate of the device. An advantage of the configuration of transistor construction 10 is that the area of the floating gate is greater than that of the control gate by virtue of the control gate being within the container-shaped floating gate, and being recessed below the uppermost surface 52 of the floating gate. Such can enable improved electric field distribution across ferroelectric material 20 and insulative material 16 relative to conventional devices. In some embodiments, sufficient electric field may be developed across ferroelectric material 20 to enable switching of the polarization of the ferroelectric material even as the electric field across insulative material 16 remains less than the breakdown voltage.

The illustrated transistor construction may be one of a plurality of substantially identical constructions utilized in integrated circuitry (for instance, a memory array). The control gate may be part of a conductive wordline that extends in and out of the page relative to the cross-section of the FIGURE, with such wordline be representative of a plurality of wordlines the may extend across an array of transistor constructions. Bitlines (not shown) may extend substantially orthogonally to the wordlines. Transistor constructions may be electrically isolated from one another along the directions of the wordlines by slicing various materials of the transistor constructions (for instance, conductive material 18, conductively-doped source/drain regions 60/62, and possibly also ferroelectric material 20) into discrete segments along the wordlines.

The source/drain regions 60/62 may be electrically connected to other components of an integrated circuit. For instance, one of the source/drain regions may be electrically coupled to a bitline (not shown) and the other may be electrically coupled to a charge-storage device (for instance a capacitor), or to a memory cell (for instance, a phase change memory cell, a conductive bridging RAM cell, another type of RRAM cell, a magnetic RAM cell, etc.)

The construction shown in the FIGURE may be formed utilizing any suitable fabrication sequence. Example fabrication sequences may use various combinations of masking, etching, implanting and deposition to form the various materials and structures of the construction. For instance, recess 14 may be formed utilizing a patterned mask over base 12 and a suitable etch into the base. Subsequently, the various materials 16, 18, 20, 22 and 24 may be formed within the recess utilizing various combinations of deposition, etching, and possible masking Threshold voltage implants (if desired) may be provided after forming the recess. The n-type doping of source/drain regions 60/62 may be conducted prior to forming recess in some embodiments, and/or after forming the recess in other embodiments.

The electronic devices discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Either of the terms "dielectric" and "electrically insulative" may be utilized to describe materials having insulative electrical properties. Both terms are considered synonymous in this disclosure. The utilization of the term "dielectric" in some instances, and the term "electrically insulative" in other instances, may provide language variation to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional view of the accompanying illustration only shows features within the plane of the cross-section, and does not show materials behind the plane of the cross-section in order to simplify the drawing.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In an example embodiment, a transistor construction includes a first insulative structure lining a recess within a base. A first conductive structure lines an interior of the first insulative structure, and a ferroelectric structure lines an interior of the first conductive structure. A second conductive structure is within a lower region of the ferroelectric structure, and the second conductive structure has an uppermost surface beneath an uppermost surface of the first conductive structure. A second insulative structure is over the second conductive structure and within the ferroelectric structure. A pair of source/drain regions are adjacent an upper region of the first insulative structure and are on opposing sides of the first insulative structure from one another.

In an example embodiment, a transistor construction includes an upwardly-opening container-shaped first insulative structure within a base. An upwardly-opening container-shaped first conductive structure is nested within a lower region of the container-shaped first insulative structure. An upwardly-opening container-shaped ferroelectric structure is within the first insulative structure and over the first conductive structure. A second conductive structure is within a lower region of the container-shaped ferroelectric structure. The second conductive structure has an uppermost surface beneath an uppermost surface of the first conductive structure. A second insulative structure is over the second conductive structure and within the container-shaped ferroelectric structure. A pair of source/drain regions are adjacent an upper region of the container-shaped first insulative structure and on opposing sides of the first insulative structure from one another. Channel material is along an outer region of the container-shaped first insulative structure and extends from one of the source/drain regions to the other.

In an example embodiment, a transistor construction includes a semiconductor base having a recess extending therein. First insulative material lines the recess and is configured as a first insulative structure having an upwardly-opening container shape. First conductive material is within the first insulative structure. The first conductive material is along a lower region of the upwardly-opening container shape of the first insulative structure and is not along an upper region of the upwardly-opening container shape of the first insulative structure. The first conductive material is configured as a first conductive structure having an upwardly-opening container shape and is nested within the lower region of the upwardly-opening container shape of the first insulative structure. Ferroelectric material is within the first insulative structure and the first conductive structure. The ferroelectric material is configured as a ferroelectric structure having an upwardly-opening container shape. An upper region of the ferroelectric structure container shape is over the first conductive structure and is directly against first insulative structure, and a lower region of the ferroelectric structure is nested within the upwardly-opening container shape of the first conductive structure. Second conductive material is within a lower region of the upwardly-opening container shape of the ferroelectric structure. The second conductive material is configured as a second conductive structure having an uppermost surface beneath an uppermost surface of the first conductive structure. Second insulative material is over the second conductive material and is within the upwardly-opening container shape of the ferroelectric structure. A pair of source/drain regions are adjacent the upper region of the upwardly-opening container shape of the first insulative structure and are on opposing sides of the first insulative structure from one another.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A transistor construction, comprising:
   a first insulative structure lining a recess within a base;
   a first conductive structure lining an interior of the first insulative structure;
   a ferroelectric structure lining an interior of the first conductive structure;
   a second conductive structure within a lower region of the ferroelectric structure; the second conductive structure having an uppermost surface beneath an uppermost surface of the first conductive structure;
   a second insulative structure over the second conductive structure and within the ferroelectric structure; and
   a pair of source/drain regions adjacent an upper region of the first insulative structure and on opposing sides of the first insulative structure from one another.

2. The transistor construction of claim 1 wherein the first conductive structure lines only a portion of the first insulative structure, with an upper portion of the first insulative structure not being lined with the first conductive structure.

3. The transistor construction of claim 2 wherein the ferroelectric structure lines an entirety of the first conductive structure and lines the upper portion of the first insulative structure.

4. The transistor construction of claim 1 wherein the first conductive structure comprises metal.

5. The transistor construction of claim 1 wherein the first conductive structure comprises metal nitride.

6. The transistor construction of claim 1 wherein the first conductive structure comprises one or both of titanium nitride and tantalum nitride.

7. The transistor construction of claim 1 wherein the first insulative structure comprises oxide.

8. The transistor construction of claim 1 wherein the first insulative structure comprises silicon dioxide.

9. The transistor construction of claim 1 wherein the ferroelectric structure comprises metal oxide.

10. The transistor construction of claim 9 wherein the ferroelectric structure includes one or more of aluminum, barium, calcium, erbium, hafnium, lanthanum, lead, magnesium, niobium, strontium, titanium, yttrium and zirconium.

11. The transistor construction of claim 1 wherein the second conductive structure comprises metal.

12. The transistor construction of claim 1 wherein the second conductive structure comprises one or both of tungsten and titanium nitride.

13. The transistor construction of claim 1 wherein the base comprises monocrystalline silicon; wherein the source/drain regions are n-type doped regions of the monocrystalline silicon of the base; and wherein a channel region between the source/drain regions is a p-type doped region of the monocrystalline silicon of the base.

14. A transistor construction, comprising:
    an upwardly-opening container-shaped first insulative structure within a base;
    an upwardly-opening container-shaped first conductive structure nested within a lower region of the container-shaped first insulative structure;
    an upwardly-opening container-shaped ferroelectric structure within the first insulative structure and over the first conductive structure;
    a second conductive structure within a lower region of the container-shaped ferroelectric structure; the second conductive structure having an uppermost surface beneath an uppermost surface of the first conductive structure;
    a second insulative structure over the second conductive structure and within the container-shaped ferroelectric structure;
    a pair of source/drain regions adjacent an upper region of the container-shaped first insulative structure and on opposing sides of the first insulative structure from one another; and
    channel material along an outer region of the container-shaped first insulative structure and extending from one of the source/drain regions to the other.

15. The transistor construction of claim 14 wherein the channel material is part of a p-type doped monocrystalline silicon base.

16. The transistor construction of claim 14 wherein the first conductive structure comprises one or both of titanium nitride and tantalum nitride.

17. The transistor construction of claim 14 wherein the ferroelectric structure comprises metal oxide.

18. The transistor construction of claim 17 wherein the ferroelectric structure includes one or more of aluminum, barium, calcium, erbium, hafnium, lanthanum, lead, magnesium, niobium, strontium, titanium, yttrium and zirconium.

19. The transistor construction of claim 18 wherein the first insulative structure comprises silicon dioxide.

20. The transistor construction of claim 19 wherein the second conductive structure comprises one or both of tungsten and titanium nitride.

21. The transistor construction of claim 20 wherein the second insulative structure comprises silicon nitride.

22. A transistor construction, comprising:
    a semiconductor base having a recess extending therein;
    first insulative material lining the recess, the first insulative material being configured as a first insulative structure having an upwardly-opening container shape;
    first conductive material within the first insulative structure; the first conductive material being along a lower region of the upwardly-opening container shape of the first insulative structure and not being along an upper region of the upwardly-opening container shape of the first insulative structure; the first conductive material being configured as a first conductive structure having an upwardly-opening container shape and nested within the lower region of the upwardly-opening container shape of the first insulative structure;

ferroelectric material within the first insulative structure and the first conductive structure; the ferroelectric material being configured as a ferroelectric structure having an upwardly-opening container shape; an upper region of the ferroelectric structure container shape being over the first conductive structure and directly against first insulative structure, and a lower region of the ferroelectric structure being nested within the upwardly-opening container shape of the first conductive structure;

second conductive material within a lower region of the upwardly-opening container shape of the ferroelectric structure; the second conductive material being configured as a second conductive structure; the second conductive structure having an uppermost surface beneath an uppermost surface of the first conductive structure;

second insulative material over the second conductive material and within the upwardly-opening container shape of the ferroelectric structure; and a pair of source/drain regions adjacent the upper region of the upwardly-opening container shape of the first insulative structure and on opposing sides of the first insulative structure from one another.

23. The transistor construction of claim 22 wherein the base comprises monocrystalline silicon; wherein the source/drain regions are n-type doped regions of the monocrystalline silicon of the base; and wherein a channel region between the source/drain regions is a p-type doped region of the monocrystalline silicon of the base.

24. The transistor construction of claim 22 wherein:
the first conductive structure comprises one or both of titanium nitride and tantalum nitride:
the ferroelectric structure comprises metal oxide and includes one or more of aluminum, barium, calcium, erbium, hafnium, lanthanum, lead, magnesium, niobium, strontium, titanium, yttrium and zirconium;
the first insulative structure comprises silicon dioxide; and
the second conductive structure comprises one or both of tungsten and titanium nitride.

25. The transistor construction of claim 24 wherein the first insulative structure has a thickness within a range of from about 5 Å to about 10 Å.

26. The transistor construction of claim 24 wherein the first conductive structure has a thickness within a range of from about 10 Å to about 20 Å.

27. The transistor construction of claim 24 wherein the ferroelectric structure has a thickness within a range of from about 30 Å to about 50 Å.

28. The transistor construction of claim 24 wherein the second insulative material comprises silicon nitride.

29. The transistor construction of claim 22 wherein the recess extends to a depth within the base which is within a range of from about 500 Å to about 5000 Å.

* * * * *